(12) United States Patent
Du et al.

(10) Patent No.: US 9,680,025 B2
(45) Date of Patent: Jun. 13, 2017

(54) TFT SWITCH AND METHOD FOR MANUFACTURING THE SAME

(71) Applicant: Shenzhen China Star Optoelectronics Technology Co., Ltd., Shenzhen, Guangdong (CN)

(72) Inventors: Peng Du, Shenzhen (CN); Cheng-hung Chen, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 142 days.

(21) Appl. No.: 14/119,189

(22) PCT Filed: Sep. 13, 2013

(86) PCT No.: PCT/CN2013/083484
§ 371 (c)(1),
(2) Date: Nov. 20, 2013

(87) PCT Pub. No.: WO2015/035615
PCT Pub. Date: Mar. 19, 2015

(65) Prior Publication Data
US 2015/0069398 A1    Mar. 12, 2015

(30) Foreign Application Priority Data
Sep. 10, 2013   (CN) .......................... 2013 1 04111352

(51) Int. Cl.
*H01L 27/14*     (2006.01)
*H01L 29/786*    (2006.01)

(52) U.S. Cl.
CPC ............................. *H01L 29/78648* (2013.01)

(58) Field of Classification Search
CPC ........................ H01L 27/1214; H01L 27/1251
USPC .......................................... 257/59, 72, 432
See application file for complete search history.

(56) References Cited

U.S. PATENT DOCUMENTS

| 8,421,081 B2 * | 4/2013 | Kato et al. ...................... 257/59 |
| 2007/0012919 A1 * | 1/2007 | Oh et al. ......................... 257/59 |
| 2012/0182514 A1 * | 7/2012 | Choi ................. G02F 1/134309 349/143 |

FOREIGN PATENT DOCUMENTS

CN            102117837 A        7/2011

* cited by examiner

*Primary Examiner* — Tan N Tran
(74) *Attorney, Agent, or Firm* — Andrew C. Cheng

(57) ABSTRACT

The present invention proposes a TFT switch and a method for manufacturing the same. The TFT switch includes a gate, a drain, a source, a semiconductor layer and a fourth electrode. The drain is connected to a first signal, the gate is connected to a control signal to control the switch on or off. The source outputs the first signal when the switch turns on. The fourth electrode and the gate are respectively located at two sides of the semiconductor layer. The fourth electrode is conductive and is selectively coupled to different voltage levels, thereby reducing leakage current in a channel to improve switch characteristic when the switch turns off.

7 Claims, 3 Drawing Sheets

TFT SWITCH AND METHOD FOR MANUFACTURING THE SAME

BACKGROUND OF THE INVENTION

1. Field of the Invention

The present invention relates to a liquid crystal display (LCD) technology field, more particularly, to a thin film transistor (TFT) switch and a method for manufacturing the same.

2. Description of the Prior Art

In detection of an LCD panel, there are two common designs for detecting circuits. One is that a detecting circuit is directly coupled to scanning lines or data lines in a display area of the panel, and it needs to cut a connection between a test circuit and a circuit in the display area by using laser after the detection. The other is that the test circuit is coupled to a signal line in the display area via a TFT switch. Signal is fed to the display area through the TFT switch when a high voltage level is applied on a gate of the TFT switch to turn it on. On the contrary, since the TFT switch turns off for disconnection between the test line and the scanning or data line in response to a low voltage level applied on the gate of the TFT switch when the panel operates normally, a process of laser cutting is therefore omitted.

Conventionally, there are three electrodes of the TFT switch for detecting circuits, i.e. a gate, a drain and a source. The gate of the TFT is in negative bias in a long term when the panel works normally, and therefore electrical characteristic of the semiconductor layer of the TFT varies to increase leakage current. FIG. 1 shows a circuit diagram of a conventional switch TFT. As FIG. 1 shows, a shorting bar is connected to drains 11 and 14 of the two TFTs. Sources 12 and 15 of the two TFTs are respectively connected to different scanning lines (GL) or data tines (DL). When two gates 13 and 16 of the TFTs are applied at a low voltage, the two TFTs switch off. If a leakage current passing through the two TFTs and the shorting bar occurs, a short circuit between the different scanning lines or data lines, i.e. a short circuit between different signals, happens and deteriorates display quality.

SUMMARY OF THE INVENTION

The present invention provides a TFT switch and the method of manufacturing the same for reducing leakage current in a channel of the TFT switch to improve switch characteristic when the switch turns off.

According to the present invention, a thin film transistor (TFT) switch comprises a gate, a drain, a source, a semiconductor layer and a fourth electrode. The drain is connected to a first signal. The gate is connected to a control signal to control the switch on or off. The source outputs the first signal when the switch turns on. The fourth electrode and the gate are respectively located at two sides of the semiconductor layer. The fourth electrode is conductive and is selectively connected to different voltage levels.

In one aspect of the present invention, the gate and the fourth electrode are connected to high voltage level when the switch turns on.

In another aspect of the present invention, the voltage level of the fourth electrode is identical to that of the gate.

In another aspect of the present invention, the voltage level of the fourth electrode is different from that of the gate.

In another aspect of the present invention, the TFT switch further comprises passivation layer and a gate insulating layer between the gate and the semiconductor layer. The drain and the source are located between the semiconductor layer and the passivation layer. The fourth electrode is located on the passivation layer. When the switch turns off, the gate is connected to a low voltage level. The fourth electrode is connected to a high voltage level to conduct accumulated electrons away from the gate side in the semiconductor layer and afterwards connected to the low voltage level.

In another aspect of the present invention, a voltage level of the fourth electrode is identical to that of the gate when the fourth electrode is connected to the low voltage level.

In still another aspect of the present invention, a voltage level of the fourth electrode is different to that of the gate when the fourth electrode is connected to the low voltage level.

In still another aspect of the present invention, the TFT switch further comprises a passivation layer and a gate insulating layer on the gate. The drain and the source are located between the gate insulating layer and the semiconductor layer. The fourth electrode is located on the semiconductor layer. The passivation layer surrounds the fourth electrode. When the switch turns off, the gate is connected to a low voltage level, and the fourth electrode is grounded to conduct accumulated electrons away from the gate side in the semiconductor layer.

In yet another aspect of the present invention, the first signal is a test signal, and the source is connected to a scanning or data line under test.

According to the present invention, a method for manufacturing a TFT switch comprises forming a gate connecting to a control signal to control the TFT switch turning on or turning off, and a gate insulating layer on a substrate in order; forming a semiconductor layer on the gate insulating layer; forming a drain connecting to a first signal and a source on the semiconductor layer, respectively, and coveting the semiconductor layer with a passivation layer; and forming a fourth electrode on the passivation layer, and the fourth electrode is selectively connected to different voltage levels.

According to the present invention, a method for manufacturing a TFT switch comprises: forming a gate connecting to a control signal to control the switch on or off, and a gate insulating layer on a substrate in order; forming a drain connecting to a first signal, and a source on the gate insulating layer respectively; forming a semiconductor layer on the drain and the source to contact the gate insulating layer; and forming a fourth electrode on the semiconductor layer and coveting surrounding of the fourth electrode with a passivation layer, and the fourth electrode is selectively connected to different voltage levels.

The benefit of the present invention is that in addition to a gate, a drain and a source inherent to a conventional TFT switch, a fourth electrode is added in the TFT switch. The drain is coupled to a first signal, and the gate is coupled to a control signal to control the switch turning on or off. The first signal is outputted from the source when the switch turns on. The fourth electrode and the gate respectively locate at two sides of a semiconductor layer. The fourth electrode is conductive and is selectively coupled to different voltage levels, thereby reducing leakage current in a channel to improve switch characteristic when the switch turns off.

DETAILED DESCRIPTION OF THE PREFERRED EMBODIMENTS

Figure 1:
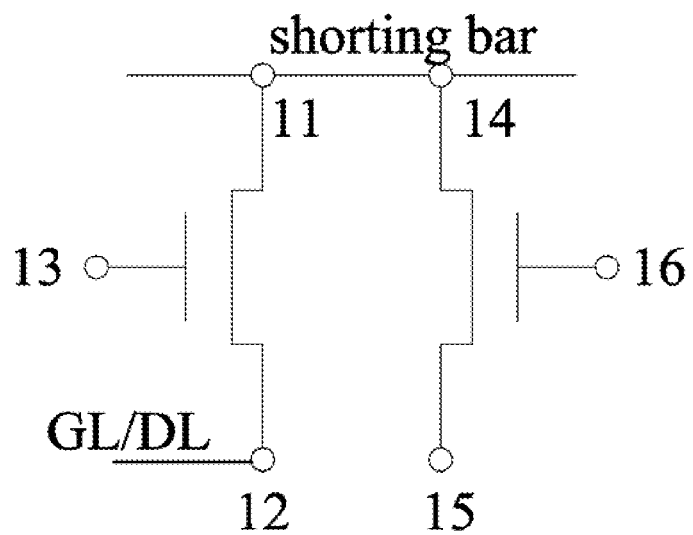
FIG. 1 shows a circuit diagram of a conventional switch TFT.
Figure 2:
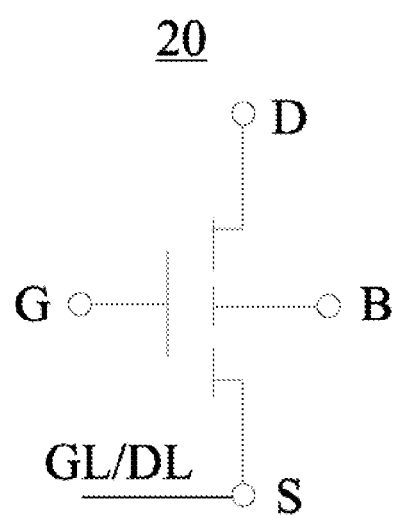
FIG. 2 shows a TFT switch according to a first embodiment of the present invention.

Please refer to FIG. 2. FIG. 2 shows a TFT switch according to a first embodiment of the present invention. As FIG. 2 shows, a TFT switch 20 comprises a gate G, a drain D, a source S, a semiconductor layer 23 among the gate G, the drain D and the source S, and a fourth electrode B. The drain D is connected to a first signal, the gate G is connected to a control signal to control the switch 20 turning on or turning off. The first signal is outputted from the source S when the switch 20 turns on. The fourth electrode B and the gate G respectively locate at two sides of the semiconductor layer 23. The fourth electrode B is selectively connected to different voltage levels. The gate G, the drain D, the source S and the fourth electrode B are made of conductive material.

In the present invention, the TFT switch 20 can be applied to different circuits like a TFT switch coupled to a pixel electrode, a test circuit, or a layout circuit of an active-matrix LCD. Preferably, the TFT switch 20 is for use in the test circuit. At this time, the first signal connected to the drain D is a test signal, the drain S is connected to the circuit under test which is data line DL or scanning line GL. The following takes a TFT switch applied to the test circuit as an example.

In the embodiment, the gate G and the fourth electrode B are connected to a high voltage level when the switch 20 turns on. At this time, the voltage level of the fourth electrode B is either same or different to that of the gate G. It is noted that difference between the two voltage levels is in a limited range. When the switch 20 starts to turn off, the gate G is connected to low voltage level, and the fourth electrode B is selectively connected to different voltage levels for conducting the leakage current far away from the gate G side in the semiconductor layer 23. And then the fourth electrode B is also connected to low voltage level. The voltage level of the fourth electrode B is either same or different to that of the gate G. It is noted that difference between the two voltage levels is in a limited range.

Figure 3:
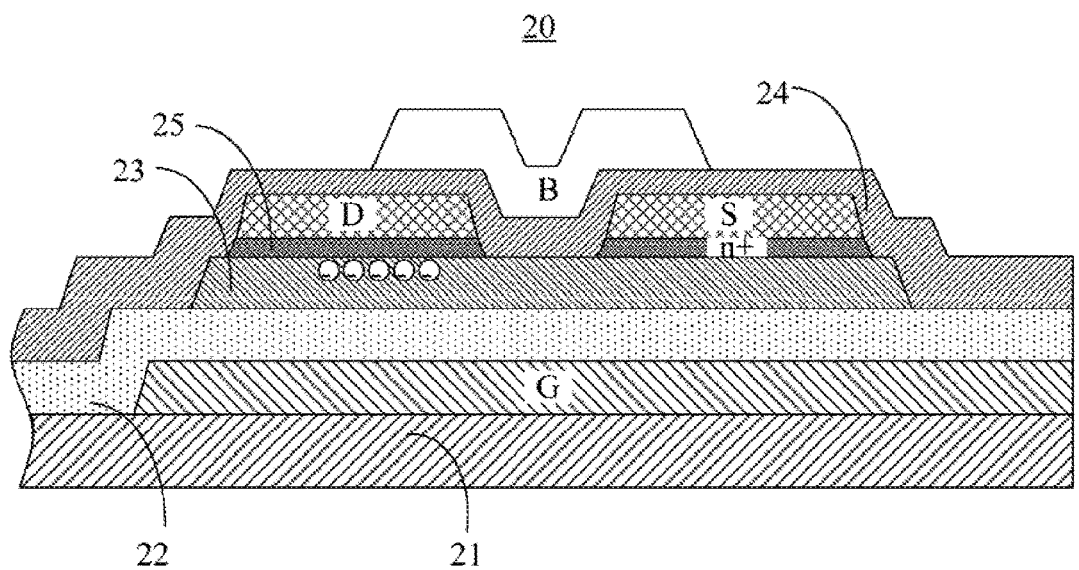
FIG. 3 is a cross-sectional view of the TFT switch according to the first embodiment of the present invention.

FIG. 3 is a cross-sectional view of the TFT switch according to the first embodiment of the present invention. As FIG. 3 illustrates, the switch 20 arranges the gate G on a base 21, a gate insulating layer 22 on the gate G and the semiconductor layer 23 on the gate insulating layer 22. Both of the drain D and the source S are set up on the semiconductor layer 23 and separated by a passivation layer 24. The passivation layer 24 also covers the whole surface. The fourth electrode B is disposed over a gap between the drain D and the source S, and extends onto the drain D and the source S. Two higher electron concentration n+ layers 25 are respectively set up between the drain D and the semiconductor layer 23, and between the source S and the semiconductor layer 23. The two n+ layers 25 are respectively part of the drain D or the source S and greatly reduce channel resistance when the switch 20 turns on.

In the embodiment, the gate is located at one side of the semiconductor layer while the drain and the source are located at an opposite side of the semiconductor layer. The gate G is connected to low voltage level, and the fourth electrode B is connected to high voltage level to conduct accumulated electrons away from the gate G side in the semiconductor layer 23 for reducing leakage current when the switch 20 turns off. The low voltage level of the fourth electrode B is either same or different to that of the gate G. It is noted that difference between the two voltage levels is in a limited range. The situation that a transition from high to low voltage level applied to the fourth electrode B is similar to a transition from high to low voltage level applied to the gate G when the switch turns off. Therefore, the electrons gathered at away from the gate G side in the semiconductor layer 23 leak out as well as the electrons close to the gate G side in the semiconductor layer 23.

Figure 4:
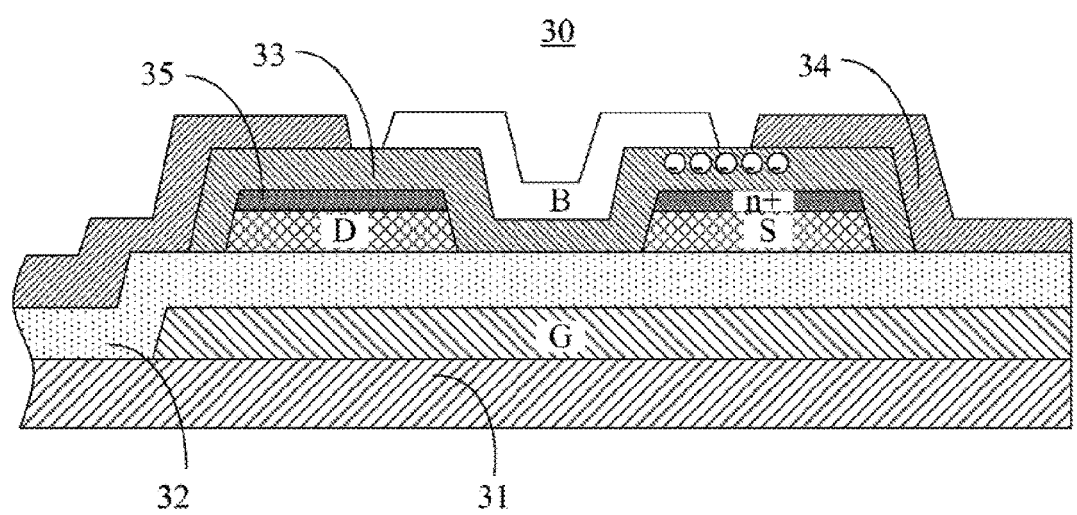
FIG. 4 is a cross-sectional view of a TFT switch according to a second embodiment of the present invention.

FIG. 4 is a cross-sectional view of a TFT switch according to a second embodiment of the present invention. As FIG. 4 illustrates, the switch 30 comprises a gate G on a base 31, a gate insulating layer 32 on the gate G. Both the drain D and the source S are set up on the gate insulating layer 32 and are separated by the semiconductor layer 33. The semiconductor layer 33 also covers the whole drain D and the source S. The fourth electrode B is disposed over a gap between the drain D and the source S and extends onto the drain D and the source S but not covering the whole drain D and the source S. The rest of the surface is covered by a passivation layer 34 surrounding the fourth electrode B, and there is a certain gap between the passivation layer 34 and the fourth electrode B. Two higher electron concentration n+ layers 35 are respectively set up between the drain D and the semiconductor layer 32 and between the source S and the semiconductor layer 32. The two layers 35 are respectively part of the drain D or the source S and greatly reduce channel resistance when the switch 30 turns on. The gate G, the drain D, the source S and the fourth electrode B are conductive.

In the embodiment, the gate G, the drain D and the source S are respectively at the same side of the semiconductor layer 33, and the fourth electrode B and the gate G are respectively at two sides of the semiconductor layer 33. The gate G is connected to low voltage level, and the fourth electrode B is grounded to conduct accumulated electrons away from the gate G side in the semiconductor layer 33 for reducing leakage current when the switch 30 turns off. When the fourth electrode 13 is connected to low voltage level, the electrons away from the gate G side in the semiconductor layer 33, which is close to the fourth electrode, B, are directly conducted out via the fourth electrode B because the fourth electrode B directly contacts the semiconductor layer 33. The voltage level of the fourth electrode B is either same or different to that of the gate G. Please pay attention that difference between the two voltage levels is in a limited range.

Figure 5:
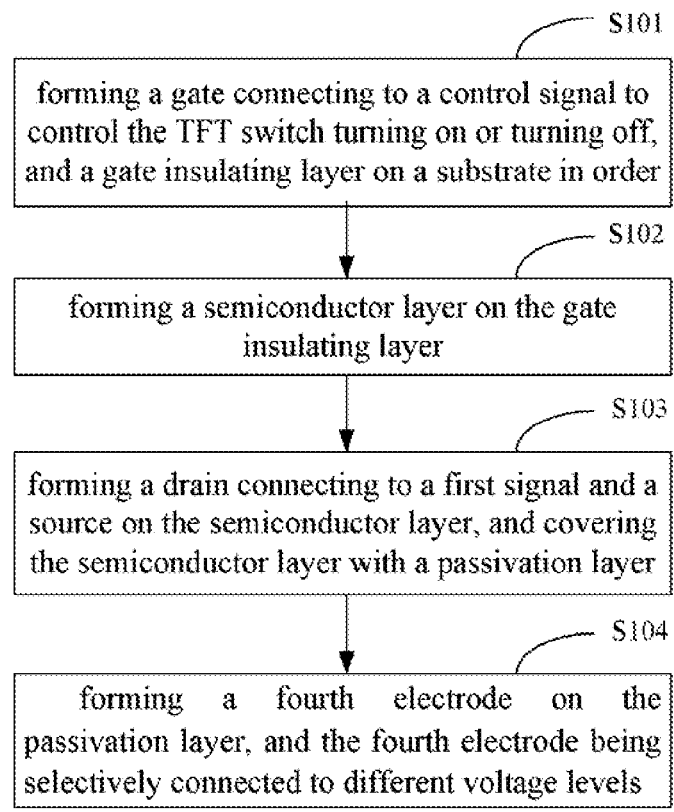
FIG. 5 is a flowchart of a manufacturing method for the TFT switch as shown in FIG. 3.

Please refer to FIG. 5, FIG. 5 is a flowchart of a manufacturing method for the TFT switch as shown in FIG. 3. As FIG. 5 shows, the manufacturing method for the TFT switch comprises the following steps:

Step S101: forming a gate, for connecting to a control signal to control a switch on or off, and a gate insulating layer on a substrate in order.

Step S102: forming a semiconductor layer on the gate insulating layer.

Step S103: forming a drain, for connecting to a first signal, and a source on the semiconductor layer respectively and covering with a passivation layer. When the TFT switch is used in a test circuit, the first signal is a test signal, and the drain connects to the test circuit. The test circuit is either data line or scanning line.

Step S104: forming a fourth electrode on the passivation layer, and the fourth electrode is selectively connected to different voltage levels.

In the embodiment, the gate is located at one side of the semiconductor layer while the drain and the source are located at an opposite side of the semiconductor layer. The fourth electrode and the gate are being connected to a high voltage when the switch turns on, and the voltage of the fourth electrode is either identical or different to that of the gate. The gate is connected to a low voltage, and the fourth electrode is connected to a high voltage to conduct accumulated electrons away from the gate side in the semiconductor layer for reducing leakage current when the switch turns off. Afterwards, the fourth electrode is connected to a low voltage, and the voltage of the fourth electrode is either identical or different to that of the gate. It is noted that difference between the two voltage levels is in a limited range.

Figure 6:
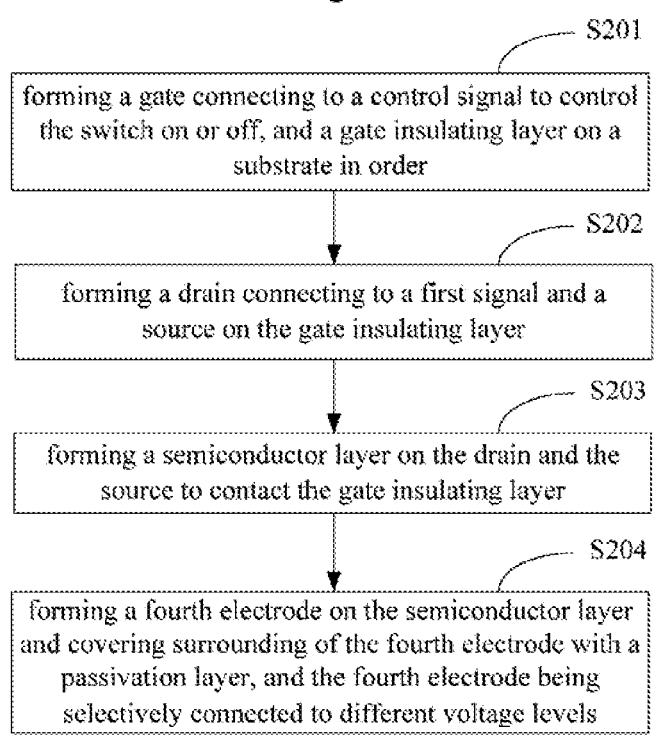
FIG. 6 is a flowchart of a manufacturing method for the TFT switch as shown in FIG. 4.

Please refer to FIG. 6, FIG. 6 is a flowchart of a manufacturing method for the TFT switch as shown in FIG. 4. As FIG. 6 shows, the manufacturing method for the TFT switch comprises the following steps:

Step S201: forming a gate, for connecting to a control signal to control a switch on or off, and a gate insulating layer on a substrate in order.

Step S202: forming a drain, for connecting to a first signal, and a source on the gate insulating layer respectively. When the TFT switch is used in a test circuit, the first signal is a test signal, and the source is used for connecting to the circuit under test. The test circuit is either data line or scanning line.

Step S203: forming a semiconductor layer on the drain and the source and contacting the gate insulating layer.

Step S204: forming a fourth electrode on the semiconductor layer and covering the surrounding of the fourth electrode with the passivation layer, and the fourth electrode is selectively connected to different voltage levels.

In the embodiment, the gate, the drain, and the source locate at the same side of the semiconductor layer. The fourth electrode and the gate are connected to a high voltage when the switch turns on, and the voltage of the fourth electrode is either identical or different to that of the gate. The gate is connected to a low voltage, and the fourth electrode is grounded to conduct electrons away from the gate side in the semiconductor layer for reducing leakage current when the switch turns off. The voltage of the fourth electrode is either identical or different to that of the gate after the switch turns off. It is noted that difference between the two voltage levels is in a limited range.

In sum, the present invention provides the TFT switch comprising the gate, the drain, the source and the fourth electrode. The drain is connected to a first signal, the gate is connected to a control signal to control the switch on or off, and the source transmits the first signal when the switch turns on. The fourth electrode and the gate locate at two sides of the source and the drain. The fourth electrode is conductive and is selectively coupled to different voltage levels, thereby reducing leakage current in a channel to improve switch characteristic when the switch turns off.

Those skilled, in the art will readily observe that numerous modifications and alterations of the device may be made while retaining the teachings of the invention. Accordingly, the above disclosure should be construed as limited only by the metes and bounds of the appended claims.

What is claimed is:

1. A thin film transistor (TFT) switch, comprising a gate, a drain, a source, a semiconductor layer, two n+ layers and a fourth electrode, the drain connected to a first signal, the gate connected to a control signal to control the switch on or off, the source outputting the first signal when the switch turns on, the fourth electrode and the gate respectively located at two sides of the semiconductor layer, the two n+ layers disposed on the semiconductor layer, and the drain and the source disposed on the two n+ layers, wherein the gate and the fourth electrode are connected to high voltage level when the switch turns on, the first signal is a test signal, and the source is connected to a data line under test.

2. The switch of claim 1, wherein the voltage level of the fourth electrode is identical to that of the gate.

3. The switch of claim 1, wherein the voltage level of the fourth electrode is different from that of the gate.

4. The switch of claim 1 further comprising a passivation layer and a gate insulating layer between the gate and the semiconductor layer, the drain and the source located between the semiconductor layer and the passivation layer, the fourth electrode located on the passivation layer; when the switch turns off, the gate is connected to a low voltage level, the fourth electrode is connected to a high voltage level to conduct accumulated electrons away from the gate side in the semiconductor layer and afterwards connected to the low voltage level.

5. The switch of claim 4, wherein a voltage level of the fourth electrode is identical to that of the gate when the fourth electrode is connected to the low voltage level.

6. The switch of claim 4, wherein a voltage level of the fourth electrode is different to that of the gate when the fourth electrode is connected to the low voltage level.

7. The switch of claim 1 further comprising a passivation layer and a gate insulating layer on the gate, the drain and the source locate between the gate insulating layer and the semiconductor layer, the fourth electrode located on the semiconductor layer, the passivation layer surrounding the fourth electrode; when the switch turns off, the gate is connected to a low voltage level, and the fourth electrode is grounded to conduct accumulated electrons away from the gate side in the semiconductor layer.

* * * * *